United States Patent
Suzuki et al.

(10) Patent No.: US 8,992,789 B2
(45) Date of Patent: Mar. 31, 2015

(54) METHOD FOR MANUFACTURING MOLD

(71) Applicant: Kabushiki Kaisha Toshiba, Tokyo (JP)

(72) Inventors: Masato Suzuki, Kanagawa-ken (JP);
Tetsuro Nakasugi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,769

(22) Filed: Feb. 28, 2013

(65) Prior Publication Data

US 2013/0240480 A1 Sep. 19, 2013

(30) Foreign Application Priority Data

Mar. 16, 2012 (JP) ................. 2012-060934

(51) Int. Cl.
| | | |
|---|---|---|
| B44C 1/22 | (2006.01) | |
| B29C 33/38 | (2006.01) | |
| G03F 7/00 | (2006.01) | |
| G03F 7/16 | (2006.01) | |
| G03F 9/00 | (2006.01) | |
| B82Y 10/00 | (2011.01) | |
| B82Y 40/00 | (2011.01) | |

(52) U.S. Cl.
CPC .......... *B29C 33/3842* (2013.01); *G03F 7/0002* (2013.01); *G03F 7/0017* (2013.01); *G03F 7/16* (2013.01); *G03F 9/7038* (2013.01); *G03F 9/7084* (2013.01); *B82Y 10/00* (2013.01); *B82Y 40/00* (2013.01)
USPC ................. 216/41; 216/58; 216/80; 436/705; 436/723

(58) Field of Classification Search
CPC ..... B82Y 40/00; G03F 7/0002; G03F 7/0017; G03F 1/00; H01L 21/31144; B29C 33/3842; G02B 3/0031; G02B 3/0075
See application file for complete search history.

(56) References Cited

U.S. PATENT DOCUMENTS

| | | | |
|---|---|---|---|
| 2005/0095824 A1 | 5/2005 | Niisoe | |
| 2008/0067721 A1 | 3/2008 | Yu et al. | |
| 2008/0213936 A1* | 9/2008 | Hatai | .............................. 438/60 |
| 2009/0315223 A1 | 12/2009 | Yoneda et al. | |
| 2010/0003830 A1 | 1/2010 | Itoh | |

(Continued)

FOREIGN PATENT DOCUMENTS

| | | |
|---|---|---|
| JP | 3-102823 | 4/1991 |
| JP | 2005-327788 | 11/2005 |

OTHER PUBLICATIONS

L.J. Guo, "Recent Progress in Nanoimprint Technology and Its Applications", J. Phys. D: Appl. Phys., vol. 37, 2004, pp. R123-R141.*

(Continued)

*Primary Examiner* — Lan Vinh
*Assistant Examiner* — Jiong-Ping Lu
(74) *Attorney, Agent, or Firm* — Finnegan, Henderson, Farabow, Garrett & Dunner, L.L.P.

(57) ABSTRACT

According to one embodiment, a method is disclosed for manufacturing a mold. The method can include forming a second major surface receded from a first major surface by irradiating a portion of the first major surface with a charged beam to etch a base material having the first major surface. The method can include forming a mask pattern on the first major surface and the second major surface. In addition, the method can include forming a first pattern on the first major surface and a second pattern on the second major surface by etching the base material through the mask pattern.

16 Claims, 8 Drawing Sheets

(56) References Cited

U.S. PATENT DOCUMENTS

| | | |
|---|---|---|
| 2010/0252188 A1 | 10/2010 | Inanami et al. |
| 2011/0027998 A1* | 2/2011 | Motoi et al. .................. 438/702 |
| 2011/0062623 A1* | 3/2011 | Saito ............................. 264/219 |
| 2011/0070739 A1* | 3/2011 | Cheng et al. .................. 438/705 |

OTHER PUBLICATIONS

Notification of Reason(s) for Refusal issued by the Japanese Patent Office on Jun. 3, 2014, for Japanese Patent Application No. 2012-060934, and English-language translation thereof.

* cited by examiner

METHOD FOR MANUFACTURING MOLD

CROSS-REFERENCE TO RELATED APPLICATIONS

This application is based upon and claims the benefit of priority from the prior Japanese Patent Application No. 2012-060934, filed on Mar. 16, 2012; the entire contents of which are incorporated herein by reference.

FIELD

Embodiments described herein relate generally to a method for manufacturing a mold.

BACKGROUND

Much attention has been given to an imprinting process as a pattern forming method which uses an original (a mold) having recesses and protrusions. The imprinting process includes coating a substrate with, for example, a photocurable organic material, and irradiating the substrate with light while the recesses and protrusions on the mold is in contact with the layer of organic material to cure the organic material. This results in a pattern of recesses and protrusions being transferred from the mold and formed in the layer of organic material.

There are cases where patterns with different depths are formed in the recesses and protrusions on this kind of mold. Therefore, it is desirable to have the ability to easily form patterns with different depths in manufacturing the mold.

DETAILED DESCRIPTION

Figure 1:
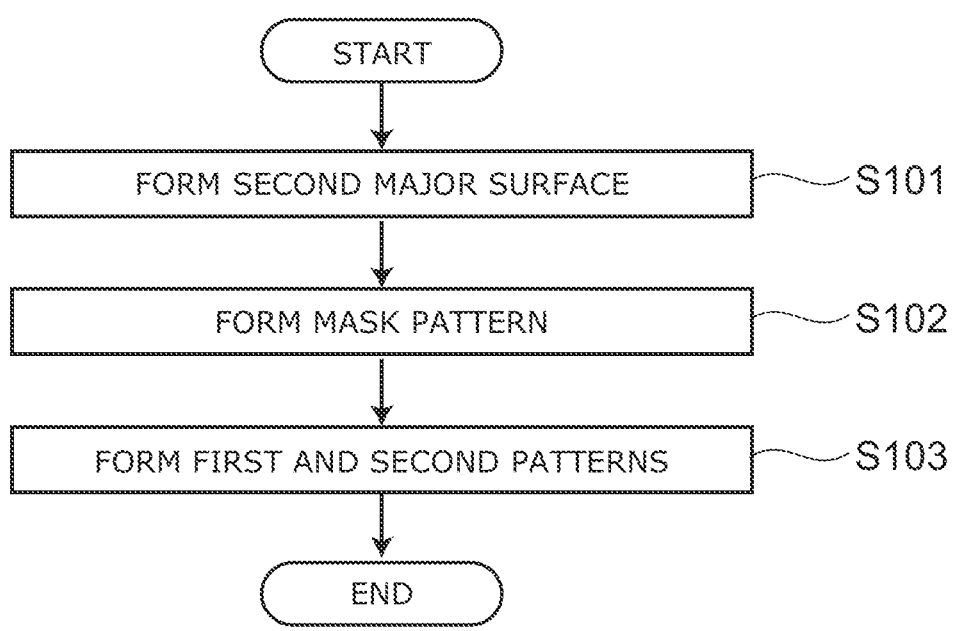
FIG. 1 is a flowchart showing a method for manufacturing a mold according to a first embodiment.

According to one embodiment, a method is disclosed for manufacturing a mold. The method can include forming a second major surface receded from a first major surface by irradiating a portion of the first major surface with a charged beam to etch a base material having the first major surface. The method can include forming a mask pattern on the first major surface and the second major surface. In addition, the method can include forming a first pattern on the first major surface and a second pattern on the second major surface by etching the base material through the mask pattern.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a flowchart showing a method for manufacturing a mold according to a first embodiment.

The method for manufacturing the mold according to the first embodiment is a method for manufacturing a mold that is used when forming a pattern using an imprinting process.

That is, the method for manufacturing the mold according to the first embodiment includes forming a second major surface (step S101), forming a mask pattern (step S102), and forming a first pattern and a second pattern (step S103).

First, when forming the second major surface in step S101, a portion of a first major surface of a base material having the first major surface is irradiated with a charged beam (e.g., ion beam or the like) to etch the base material. Thereby, the second major surface is formed, which is receded from the first major surface.

Next, when forming the mask pattern in step S102, the mask pattern is formed on the first major surface and the second major surface. The mask pattern includes openings for forming the first pattern and openings for forming the second pattern.

Next, when forming the first and second patterns in step S103, the base material is etched through the mask pattern to form the first pattern on the first major surface and the second pattern on the second major surface. The mold is complete after performing these processes.

Figure 2A:
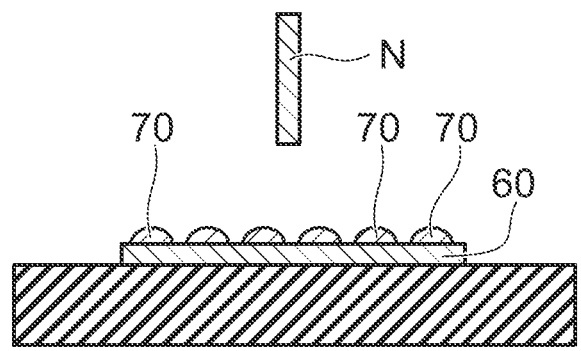
FIGS. 2A through 2C are schematic cross-sectional views illustrating an imprinting process that uses the mold.
Figure 2B:
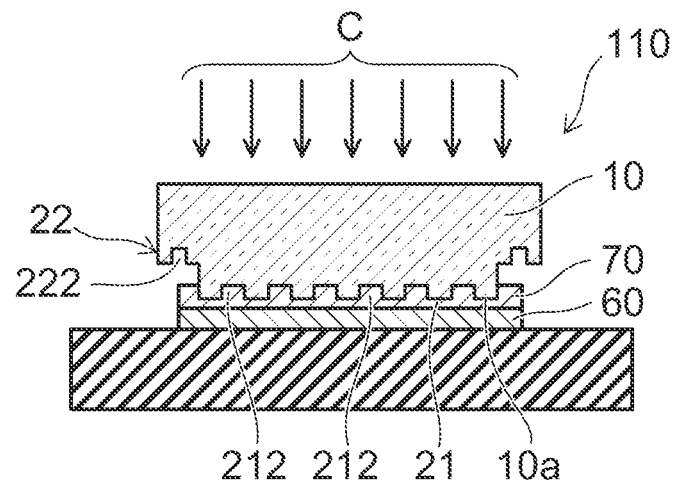
Figure 2C:
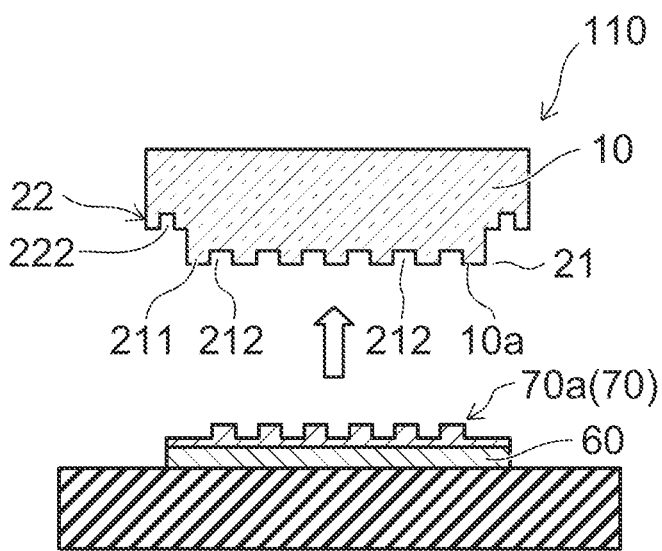

FIGS. 2A through 2C are schematic cross-sectional views illustrating an imprinting process that uses the mold.

A mold manufactured by way of the embodiment is used in the following kind of imprinting process.

First, as shown in FIG. 2A, an object to be patterned 70 is provided on a substrate 60 (step S101 in FIG. 1). A photocurable organic material, for example, is used as the object to be patterned 70. The object to be patterned 70, for example, is dripped onto the substrate 60 from a nozzle N via an inkjet process. Moreover, the object to be patterned 70 may also be uniformly provided by spin coating and the like.

Next, a mold 110 is prepared as shown in FIG. 2B. The mold 110 used in the pattern forming method according to the embodiment is provided with a first pattern 21 formed on a major surface 10a of a base material 10 and a second pattern 22. The first pattern 21 is a pattern having recesses and protrusions for forming a pattern on the object to be patterned 70. The second pattern 22 is a base pattern used for positioning the mold 110 (referred to as an alignment mark below).

The optical constant of the base material 10 of the mold 110 is almost the same as the optical constant of the object to be patterned 70. Therefore, if the second pattern 22 which is the alignment mark is filled with the object to be patterned 70, the mark tends to be indistinguishable from the base material 10 of the mold 110 from the second pattern 22 which is the alignment mark. Thus, it tends to be difficult to position the mold 110 (referred to below as alignment). For that reason, to prevent the alignment mark on the mold 110 from being filled with organic material, the alignment mark (the second pattern 22) is formed at a position carved further in a depth direction than the recesses and protrusions of the first pattern 21.

Further, the first pattern 21 on the mold 110 is placed in contact with the object to be patterned 70. The object to be patterned 70 intrudes into a recess pattern 212 of the first pattern 21 via capillary action and fills the inside of the recess pattern 212. Whereas, since the second pattern 22 is provided further receded from the major surface 10a than the first pattern 21, the object to be patterned 70 does not intrude into a recess pattern 222 of the second pattern 22.

Alignment of the mold 110 is then performed in this state. For example, alignment may be performed by aligning the second pattern 22 with a foundation pattern (mark) provided on the substrate 60. The object to be patterned 70 has not intruded into the second pattern 22, therefore, the second pattern 22 can be reliably recognized and proper alignment can be performed.

Next, light C is radiated from the base material 10 side of the mold 110 with the first pattern 21 of the mold 110 in contact with the object to be patterned 70. The light C may be ultraviolet light and is transmitted through the base material 10 and the first pattern 21, and the object to be patterned 70 is irradiated with the light. The object to be patterned 70, which is a photocurable organic material, is cured when irradiated with light.

As shown in FIG. 2C, the mold 110 is then removed from the object to be patterned 70. Hereby, a transfer pattern 70a to which the recesses and protrusions of the first pattern 21 on the mold 110 are transferred is formed on the object to be patterned 70. For example, prescribed patterns may be formed within a semiconductor device by means of an imprinting process that employs the mold 110.

Next, a specific example of the method for manufacturing the mold according to the first embodiment will be described.

This specific example describes a case where a pattern of recesses and protrusions for forming a device pattern is formed in the first pattern 21; and a pattern of recesses and protrusions for forming an alignment mark is formed in the second pattern 22.

FIGS. 3A through 3E are schematic cross-sectional views showing a specific example of the method for manufacturing the mold according to the first embodiment.

Figure 3A:
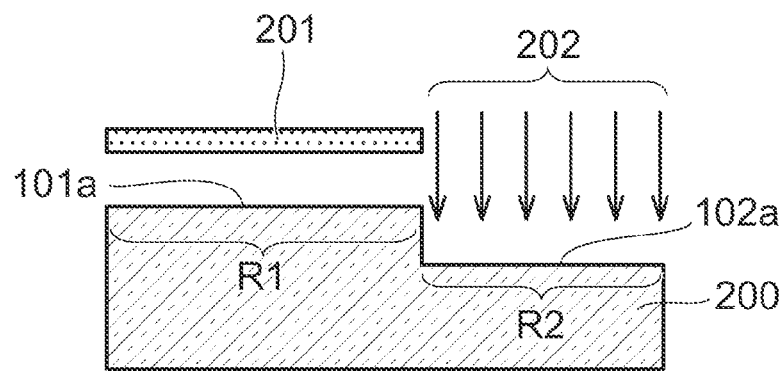
FIGS. 3A through 3E are schematic cross-sectional views showing the method for manufacturing the mold according to the first embodiment.

First, as shown in FIG. 3A, an alignment mark region R2 (a second region) excluding a device pattern region R1 (a first region) on, for example, a quartz substrate 200 which acts as the base material 10 is selectively irradiated with ions 202 and etched. That is, an ion implantation device (not illustrated) shields the upper part of the device pattern region R1 with a mask 201. The quartz substrate 200 is selectively etched by the ions 202 under a gas atmosphere. The etching is performed under a gas atmosphere to accelerate the process. Hereby, the top surface of the alignment mark region R2 is receded from the top surface of the device pattern region R1 (the first major surface 101a) on the quartz substrate 200. The receded surface is the second major surface 102a.

Figure 3B:
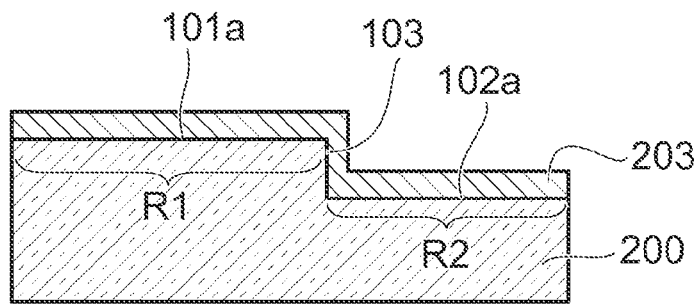

Next, as shown in FIG. 3B, a protective film 203 is formed on the top surface of the quartz substrate 200. Chromium nitride (CrN) may be used as the material for the protective film 203. The protective film 203 is formed so as to cover the first major surface 101a and the second major surface 102a. Furthermore, the protective film 203 is also formed on a step 103 provided between the first major surface 101a and the second major surface 102a.

Figure 3C:
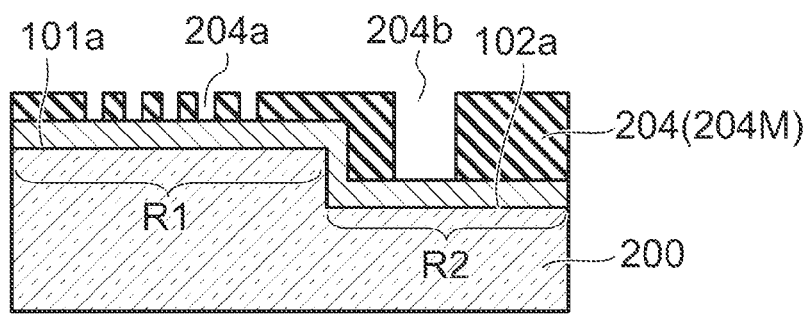

Next, as shown in FIG. 3C, a resist film 204M is formed on the protective film 203 to form a resist pattern 204 via photolithography and etching. The resist pattern 204 includes a device resist pattern 204a provided on the first major surface 101a, and an alignment mark resist pattern 204b provided on the second major surface 102a.

Moreover, an imprinting process which uses a mold for forming a mask pattern (not illustrated) may be used when forming the resist pattern 204.

Figure 3D:
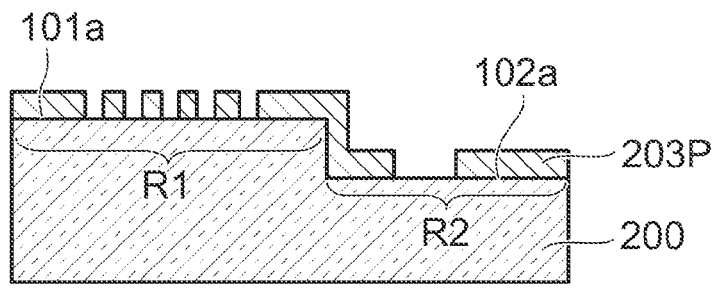

Next, etching of the protective film 203 is performed through the resist pattern 204. Hereby, as shown in FIG. 3D, the protective film 203 forms a mask pattern 203P.

Figure 3E:
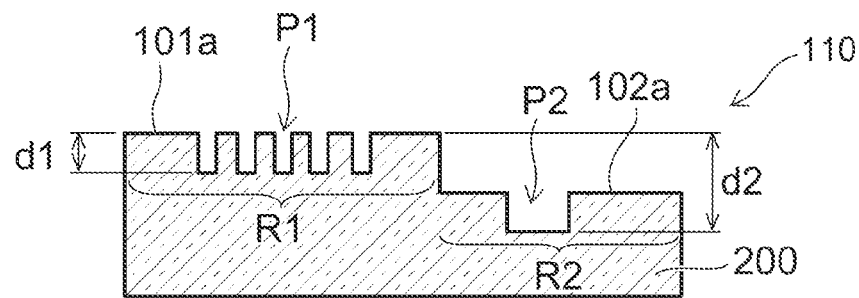

Next, as shown in FIG. 3E, the quartz substrate 200 is etched through the mask pattern 203P. Then, removing the mask pattern 203P forms a device pattern P1 on the first major surface 101a, and an alignment mark pattern P2 on the second major surface 102a. Hereby, the mold 110 is completed.

In the mold 110, the device pattern P1 is formed at a first depth d1 from the first major surface 101a. Furthermore, in the mold 110, the alignment mark pattern P2 is formed at a second depth d2 from the first major surface 101a. Since the alignment mark pattern P2 is provided receded from the second major surface 102a, the second depth d2 is deeper than the first depth d1.

According to such a method for manufacturing the mold, selectively irradiating ions 202 and etching only the alignment mark region R2 on the base material 10 (the quartz substrate 200) whereon the alignment mark pattern P2 will be formed forms the alignment mark pattern P2 at a position that is carved further in a depth direction than the device pattern region R1 whereon the device pattern P1 will be formed.

Reference Example

FIGS. 4A through 4E are schematic cross-sectional views showing a specific example of a method for manufacturing a mold according to a reference example.

Figure 4A:
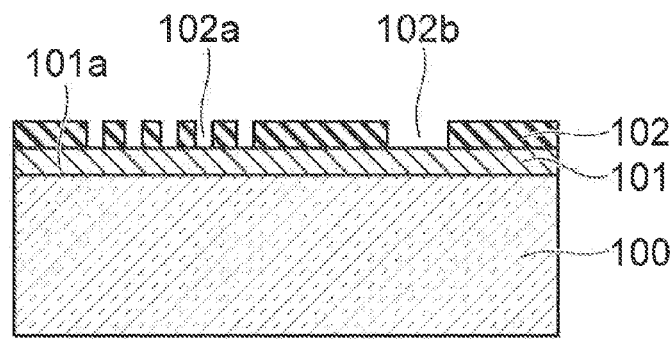
FIGS. 4A through 4E are schematic cross-sectional views showing a specific example of a method for manufacturing a mold according to a reference example.

First, as shown in FIG. 4A, a protective film 101 is formed on, for example, a quartz substrate 100 which is the base material 10. Here, for example, chromium nitride (CrN) is used as the material for the protective film 101.

Next, a desired resist pattern 102 is formed on the protective film 101 using photolithography and etching. The resist pattern 102 includes a device resist pattern 102a and an alignment mark resist pattern 102b, provided on the first major surface 101a.

Figure 4B:
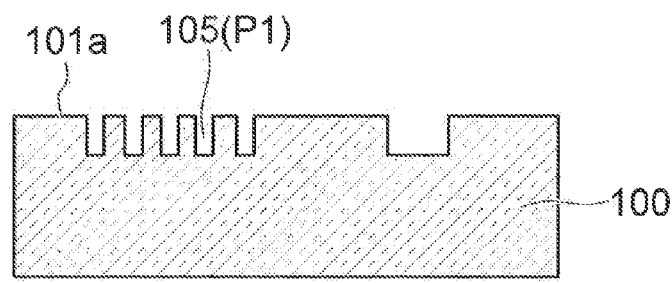

Then, as shown in FIG. 4B, with the resist pattern 102 functioning as a mask, the protective film 101 and the quartz substrate 100 are etched to a desired depth to form a quartz substrate pattern 105. The quartz substrate pattern 105 on the device pattern region is the device pattern P1.

Figure 4C:
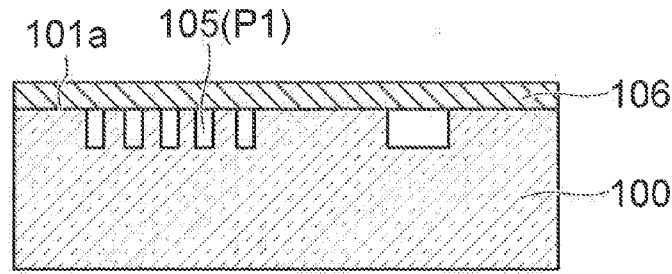

Subsequently, as shown in FIG. 4C, a protective film 106 is formed over the quartz substrate pattern 105. Here, for example, chromium nitride (CrN) is used as the material for the protective film 106.

Figure 4D:
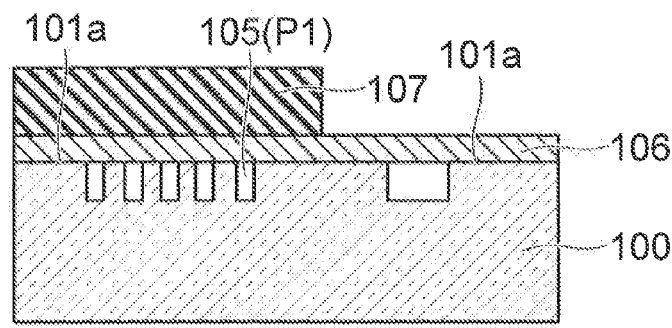

Next, as shown in FIG. 4D, a resist pattern 107 is formed on the protective film 106 so as to cover the device pattern region under the protective film 106. The resist pattern 107 is formed by photolithography and etching on a resist film formed over the protective film 106.

Figure 4E:
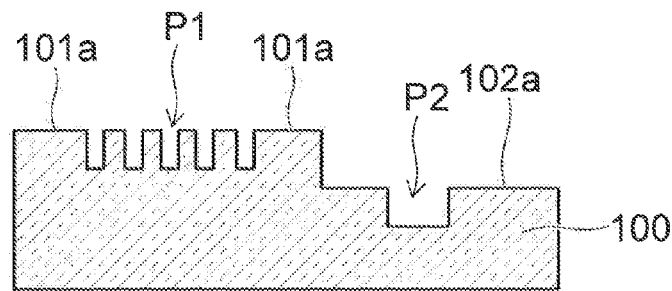

Then, as shown in FIG. 4E, the protective film 106 above the alignment mark region is etched and the quartz substrate 100 is further etched with the resist pattern 107 functioning as a mask. Subsequently, the resist pattern 107 above the device pattern P1, and the protective film 106 are removed. As a result, an alignment mark pattern P2 is formed at a position carved further in a depth direction than the device pattern P1.

In the above-mentioned method for manufacturing the mold according to the reference example, photolithography and etching are performed when forming the device pattern P1 and when forming the alignment mark pattern P2. Since lithography is an expensive technology, it is preferable to reduce its use as much as possible during the manufacturing process.

In the method for manufacturing the mold according to the embodiment, photolithography and etching are only performed when forming the mask pattern 203P. Accordingly, the photolithography and etching processes are used fewer times and the mold 110 is easier to be manufactured in the embodiment compared to the reference example.

Second Embodiment

Figure 5:
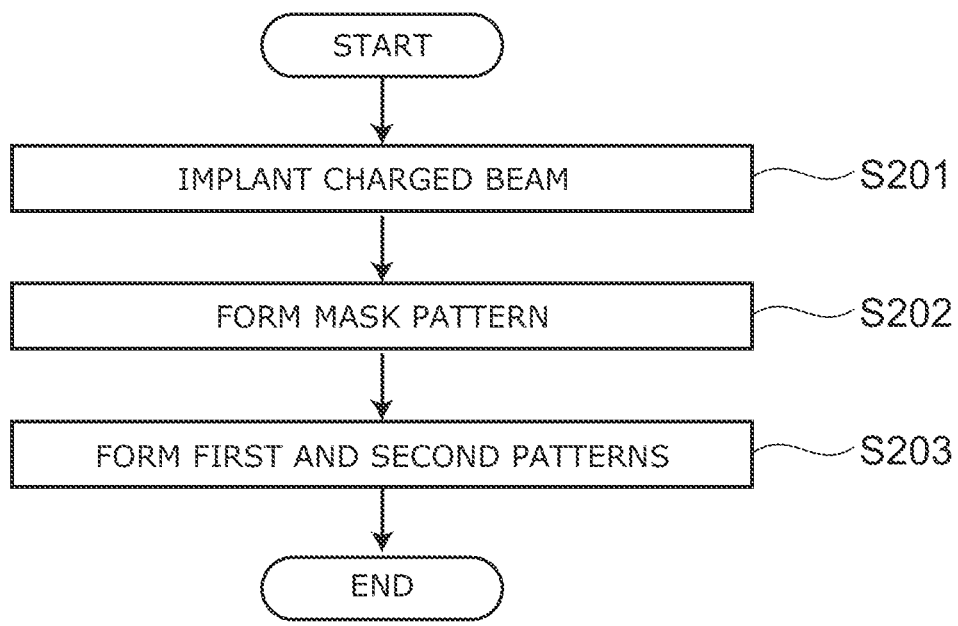
FIG. 5 is a flowchart showing a method for manufacturing a mold according to a second embodiment.

FIG. 5 is a flowchart showing a method for manufacturing a mold according to a second embodiment.

The method for manufacturing the mold according to the second embodiment includes implanting a charged beam (step S201), forming a mask pattern (step S202), and forming a first pattern and a second pattern (step S203).

First, when implanting the charged beam in step S201, the charged beam is implanted in a second region of a base material having a first region and a second region. That is to say, the charged beam is implanted in the second region without being implanted in the first region.

Next, when forming the mask pattern in step S202, the mask pattern is formed on the first region and the second region. The mask pattern is provided with openings for forming a first pattern, and openings for forming a second pattern.

Next, when forming the first pattern and the second pattern in step S203, the first region and the second region are simultaneously etched through the mask pattern. The etching forms the first pattern having a first depth in the first region, and the second pattern having a second depth that is deeper than the first depth in the second region. The mold is complete after performing these processes.

A specific example of the method for manufacturing the mold according to the second embodiment will now be described.

This specific example describes a case where the first pattern 21 has a pattern of recesses and protrusions for forming a device pattern; and the second pattern 22 has a pattern of recesses and protrusions for forming an alignment mark for the mold.

FIGS. 6A through 6D are schematic cross-sectional views showing the specific example of the method for manufacturing the mold according to the second embodiment.

Figure 6A:
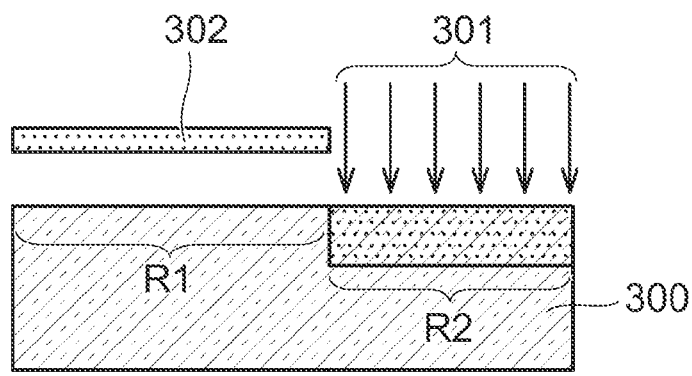
FIGS. 6A through 6D are schematic cross-sectional views showing a specific example of the method for manufacturing the mold according to the second embodiment.

First, as shown in FIG. 6A, ions 301 are implanted in an alignment mark region R2 (a second region) excluding a device pattern region R1 (a first region) of a quartz substrate 300, which is a base material 10. That is to say, the upper part of the device pattern region R1 is shielded with a mask 302, and an ion implantation device (not illustrated) implants ions 301 in the quartz substrate 300.

The type of ions 301 used is at least one selected from a group consisting of antimony, xenon, and lead. The type of ions 301 that is used is charged particle such that implanting the charged particle will make the etching rate in the alignment mark region R2 faster than the etching rate in the device pattern region R1.

One example of the ion implantation conditions includes the accelerating voltage being not less than 100 kilovolts (kV) and not more than 200 kV in the case of antimony. The dose amount is not less than $2\times10^{16}$ ions/cm$^2$ and not more than $4\times10^{16}$ ions/cm$^2$.

The ions 301 are implanted in the quartz substrate 300 at, for example, a depth of approximately not less than 1 μm and not more than 5 μm from the top surface of the quartz substrate 300.

Figure 6B:
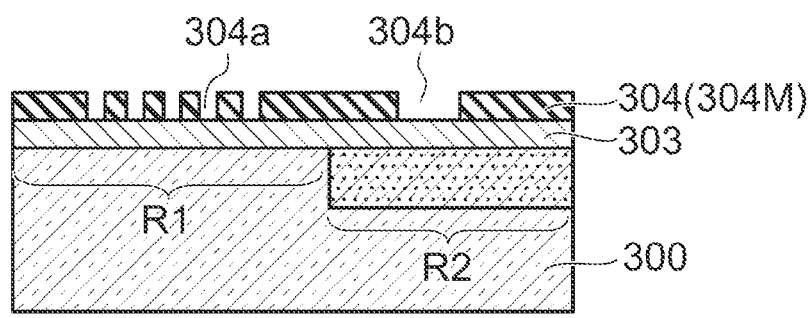

Next, as shown in FIG. 6B, a protective film 303 is formed on the quartz substrate 300. Here, for example, chromium nitride (CrN) is used as the material for the protective film 303.

Next, a resist film 304M is formed on the protective film 303 to form a resist pattern 304 using photolithography and etching. The resist pattern 304 includes a device resist pattern 304a provided on the device pattern region R1, and an alignment mark resist pattern 304b provided on the alignment mark region R2.

An imprinting process that employs the mold used to form the mask pattern (not illustrated) may be used when forming the resist pattern 304. Since the resist film 304M is provided on the flat top surface of the quartz substrate 300, it is easy to form the resist pattern 304 with an imprinting process that employs the mold used to form the mask pattern (not illustrated).

Figure 6C:
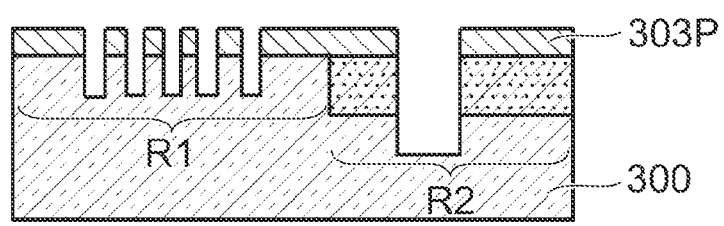
Figure 6D:
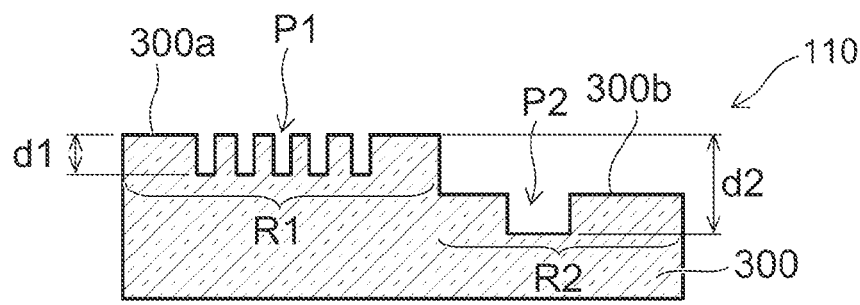

Subsequently, the protective film 303 is etched through the resist pattern 304, forming a mask pattern 303P as shown in FIG. 6C.

Next, the device pattern region R1 and the alignment mark region R2 on the quartz substrate 300 are simultaneously etched through the mask pattern 303P. The mask pattern 303P is also etched at this time.

Here, the etching rate in the alignment mark region R2 which was implanted with ions 301 is faster than the etching rate in the device pattern region R1 which was not implanted with ions 301. Therefore, the alignment mark region R2 is more deeply etched compared to the device pattern region R1.

Subsequently, removing the mask pattern 303P forms a device pattern P1 in the device pattern region R1 and an alignment mark pattern P2 in the alignment mark region R2. Hereby, the mold 110 is complete.

In the mold 110, the device pattern P1 is formed at a first depth d1 from the top surface of the device pattern region R1 (the first major surface 300a on the quartz substrate 300). Further, in the mold 110, the alignment mark pattern P2 is formed at a second depth d2 from the top surface of the device pattern region R1. Since the alignment mark pattern P2 is provided receded from the top surface of the alignment mark region R2 (the second major surface 300b on the quartz substrate 300), the second depth d2 is deeper than the first depth d1.

According to such a method for manufacturing a mold, implanting ions 301 that will cause selective increase of the etching rate in only the alignment mark region R2 on the base material 10 (the quartz substrate 300) whereon the alignment mark pattern P2 will be formed forms an alignment mark pattern P2 that is carved further in a depth direction than the device pattern region R1, even if both regions are etched simultaneously.

In the method for manufacturing the mold according to the embodiment, photolithography and etching are used only when forming the mask pattern 303P. Accordingly, the photolithography and etching processes are used fewer times and the mold 110 is easier to be manufactured in the embodiment compared to the reference example.

Third Embodiment

Figure 7:
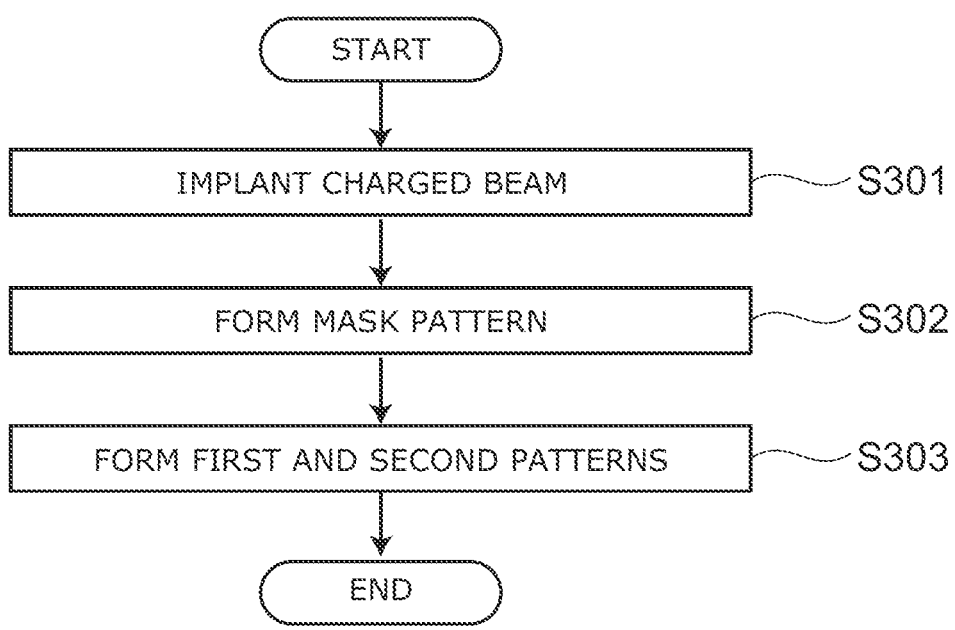
FIG. 7 is a flowchart showing a method for manufacturing a mold according to a third embodiment.

FIG. 7 is a flowchart showing a method for manufacturing a mold according to a third embodiment.

The method for manufacturing the mold according to the third embodiment includes implanting a charged beam (step S301), forming a mask pattern (step S302), and forming a first pattern and a second pattern (step S303).

First, when implanting the charged beam in step S301, a charged beam is implanted in a second region of a base material having a first region and a second region. In other words, the charged beam is implanted in the second region, without being implanted in the first region.

Next, when forming the mask pattern in step S302, a mask pattern is formed on the first region and the second region. The mask pattern is provided with openings for forming a first pattern, and openings for forming a second pattern.

Next, when forming the first pattern and the second pattern in step S303, the first region and the second region are simultaneously etched through the mask pattern. The etching forms the first pattern having a first depth in the first region, and the second pattern having a second depth that is deeper than the first depth in the second region. The mold is complete after performing these processes.

Next, a specific example of the method for manufacturing the mold according to the third embodiment will now be described.

This specific example describes a case where the first pattern 21 has a pattern of recesses and protrusions for forming a device pattern; and the second pattern 22 also has a pattern of recesses and protrusions for forming an alignment mark for the mold.

FIGS. 8A through 8D are schematic cross-sectional views showing the specific example of the method for manufacturing the mold according to the third embodiment.

Figure 8A:
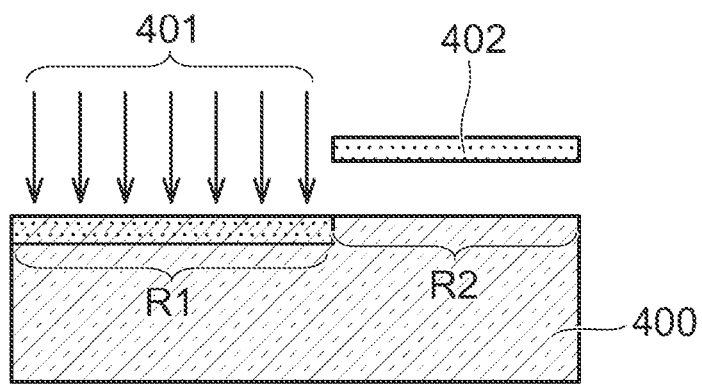
FIGS. 8A through 8D are schematic cross-sectional views showing a specific example of the method for manufacturing the mold according to the third embodiment.

First, as shown in FIG. 8A, ions 401 are implanted in a device pattern region R1 (a first region) excluding an alignment mark region R2 (a second region) of a quartz substrate 400, which is a base material 10. In other words, the upper part of the alignment mark region R2 is shielded with a mask 402, and an ion implantation device (not illustrated) implants ions 401 in the quartz substrate 400.

The type of ions 401 used is at least one selected from a group consisting of gallium, arsenic, and indium. The type of ions 401 that is used is charged particle such that implanting the charged particle will make the etching rate of the alignment mark region R2 slower than the etching rate of the device pattern region R1.

Figure 8B:
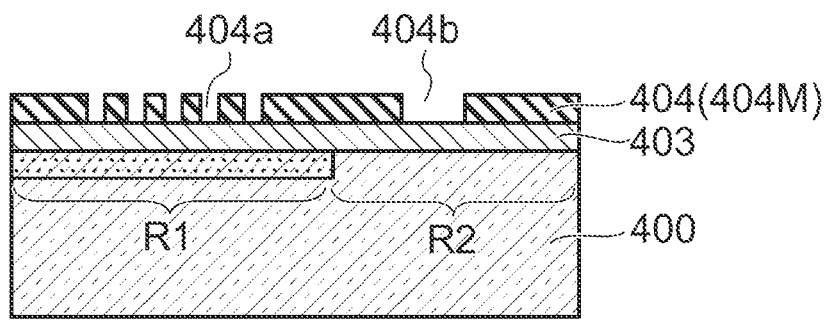

Next, as shown in FIG. 8B, a protective film 303 is formed on the quartz substrate 400. Here, for example, chromium nitride (CrN) is used as the material for the protective film 403.

Next, a resist film 404M is formed on the protective film 403 to form a resist pattern 404 using photolithography and etching. The resist pattern 404 includes a device resist pattern 404a provided on the device pattern region R, and an alignment mark resist pattern 404b provided on the alignment mark region R2.

An imprinting process that employs the mold used to form the mask pattern (not illustrated) may be used when forming the resist pattern 404. Since the resist film 404M is provided on the flat top surface of the quartz substrate 400, it is easy to form the resist pattern 404 with an imprinting process that employs the mold used to form the mask pattern (not illustrated).

Figure 8C:
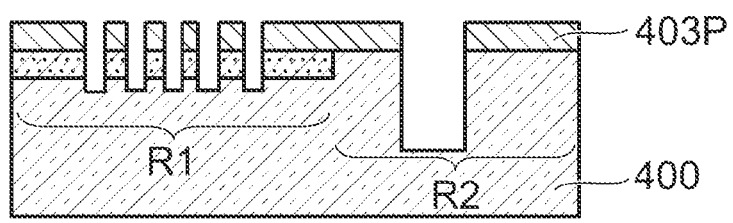
Figure 8D:
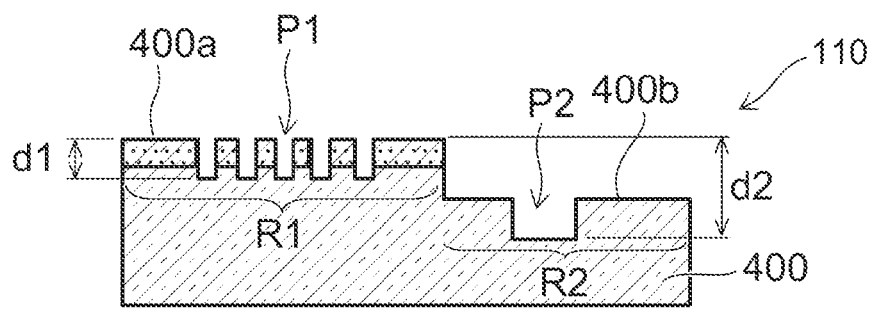

Thereafter, the protective film 403 is etched through the resist pattern 404, forming a mask pattern 403P as shown in FIG. 8C.

Next, the device pattern region R1 and the alignment mark region R2 on the quartz substrate 400 are simultaneously etched through the mask pattern 403P. The mask pattern 403P is also etched at this time.

Here, the etching rate in the alignment mark region R2 which was not implanted with ions 401 is slower than the etching rate in the device pattern region R1 which was implanted with ions 401. Therefore, the device pattern region R1 is more shallowly etched compared to the alignment mark region R2. In other words, the alignment mark region R2 is more deeply etched compared to the device pattern region R1.

Subsequently, removing the mask pattern 403P forms a device pattern P1 in the device pattern region R1 and an alignment mark pattern P2 in the alignment mark region R2. Hereby, the mold 110 is complete.

In the mold 110, the device pattern P1 is formed at a first depth d1 from the top surface of the device pattern region R1 (the first major surface 400a on the quartz substrate 400). In the mold 110, the alignment mark pattern P2 is formed at a second depth d2 from the top surface of the device pattern region R1. Since the alignment mark pattern P2 is provided receded from the top surface of the alignment mark region R2 (the second major surface 400b on the quartz substrate 400), the second depth d2 is deeper than the first depth d1.

According to such a method for manufacturing the mold, implanting ions 401 that will selectively reduce the etching rate in only the device pattern region R1 on the base material 10 (the quartz substrate 400) whereon the device pattern P1 will be formed forms an alignment mark pattern P2 that is more deeply carved than the device pattern region R1, even if both regions are etched simultaneously.

In the method for manufacturing the mold according to the embodiment, photolithography and etching are used only when forming the mask pattern 403P. Accordingly, the photolithography and etching processes are used fewer times and the mold 110 is easier to be manufactured in this embodiment compared to the reference example.

As described above, with the methods for manufacturing the mold according to the embodiments, a pattern having different depths can be easily formed.

Although various embodiments have been described above, the invention is not limited to these examples. For example, the above-mentioned embodiments, illustrated an exemplary case where a pattern of recesses and protrusions for forming a device pattern was provided in the first pattern, and a pattern of recesses and protrusions for forming an alignment mark was provided in the second pattern. However, the invention is not limited to the first pattern being the device pattern, and the second pattern being the alignment mark.

Additions, deletions, or design modifications of components or appropriate combinations of the features of the embodiments appropriately made by one skilled in the art in regard to the embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a mold, comprising:
    forming a second major surface receded from a first major surface by irradiating a portion of the first major surface with a charged beam to etch a base material having the first major surface, an upper part of another portion of the first major surface being shielded by a mask spaced from the first major surface while irradiating the portion of the first major surface;

forming a mask pattern on the first major surface and the second major surface; and forming a first pattern on the first major surface and a second pattern on the second major surface by etching the base material through the mask pattern.

2. The method according to claim 1, wherein the second pattern is a pattern used for positioning in forming a transfer pattern with the first pattern.

3. The method according to claim 1, wherein the forming the mask pattern includes transferring a pattern shape of the mask pattern with imprinting process employing a mold for forming the mask pattern.

4. The method according to claim 1, wherein the forming the second major surface includes performing etching under a gas atmosphere.

5. The method according to claim 1, wherein the base material is quartz.

6. A method for manufacturing a mold, comprising:
implanting a charged beam in a second region of a base material having a first region and the second region, an upper part of the first region being shielded by a mask spaced from the first region, the base material being quartz;

forming a mask pattern on the first region and the second region; and forming a first pattern having a first depth in the first region and a second pattern having a second depth deeper than the first depth in the second region by simultaneously etching the first region and the second region through the mask pattern.

7. The method according to claim 6, wherein the implanting the charged beam includes implanting a charged particle, the implanting the charged particle making an etching rate in the second region faster than an etching rate in the first region.

8. The method according to claim 6, wherein the second pattern is a pattern used for positioning in forming a transfer pattern with the first pattern.

9. The method according to claim 6, wherein the forming the mask pattern includes transferring a pattern shape of the mask pattern with imprinting process employing a mold for forming the mask pattern.

10. The method according to claim 6, wherein the charged beam includes an ion, and an element of the ion is at least one selected from the group consisting of antimony, xenon, and lead.

11. A method for manufacturing a mold, comprising:
implanting a charged beam in a first region of a base material having the first region and a second region, an upper part of the second region being shielded by a mask spaced from the second region;

forming a mask pattern on the first region and the second region; and forming a first pattern having a first depth in the first region, and a second pattern having a second depth deeper than the first depth in the second region by simultaneously etching the first region and the second region through the mask pattern.

12. The method according to claim 11, wherein the implanting a charged beam includes implanting a charged particle such that the implanting the charged particle making an etching rate in the first region slower than an etching rate in the second region.

13. The method according to claim 11, wherein the second pattern is a pattern used for positioning in forming a transfer pattern with the first pattern.

14. The method according to claim 11, wherein the forming the mask pattern includes transferring a pattern shape of the mask pattern with imprinting process employing a mold for forming the mask pattern.

15. The method according to claim 11, wherein the charged beam includes an ion, and an element of the ion is at least one selected from the group consisting of gallium, arsenic, and indium.

16. The method according to claim 11, wherein the base material is quartz.

* * * * *